(12) United States Patent
Dutta et al.

(10) Patent No.: US 8,885,404 B2
(45) Date of Patent: Nov. 11, 2014

(54) NON-VOLATILE STORAGE SYSTEM WITH THREE LAYER FLOATING GATE

(71) Applicant: Sandisk Technologies Inc., Plano, TX (US)

(72) Inventors: Deepanshu Dutta, Santa Clara, CA (US); Shinji Sato, Chigasaki (JP); Masaaki Higashitani, Cupertino, CA (US); Dengtao Zhao, Santa Clara, CA (US); Sanghyun Lee, Davis, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/715,682

(22) Filed: Dec. 14, 2012

(65) Prior Publication Data

US 2013/0163340 A1 Jun. 27, 2013

Related U.S. Application Data

(60) Provisional application No. 61/580,203, filed on Dec. 24, 2011.

(51) Int. Cl.
| | | |
|---|---|---|
| *G11C 16/04* | (2006.01) | |
| *H01L 29/792* | (2006.01) | |
| *H01L 29/66* | (2006.01) | |
| *H01L 21/28* | (2006.01) | |
| *G11C 16/10* | (2006.01) | |
| *H01L 29/788* | (2006.01) | |
| *H01L 27/115* | (2006.01) | |

(52) U.S. Cl.
CPC .......... *G11C 16/10* (2013.01); *H01L 21/28273* (2013.01); *H01L 29/66825* (2013.01); *H01L 27/11524* (2013.01); *G11C 16/0483* (2013.01); *H01L 29/788* (2013.01); *H01L 29/7887* (2013.01)
USPC ............ 365/185.01; 365/185.28; 365/185.33; 257/324; 257/325

(58) Field of Classification Search
USPC ..................................... 365/185.01
See application file for complete search history.

(56) References Cited

U.S. PATENT DOCUMENTS

| | | | |
|---|---|---|---|
| 5,319,229 A * | 6/1994 | Shimoji et al. ................ | 257/324 |
| 6,596,590 B1 * | 7/2003 | Miura et al. ................... | 438/261 |
| 6,630,383 B1 | 10/2003 | Ibok | |

(Continued)

FOREIGN PATENT DOCUMENTS

JP    2000-0299395 A    10/2000

OTHER PUBLICATIONS

English Translation of Abstract of Japanese Patent Application No. JP 2000-0299395.

(Continued)

*Primary Examiner* — Son Mai
(74) *Attorney, Agent, or Firm* — Vierra Magen Marcus LLP (57) ABSTRACT

A non-volatile storage system includes memory cells with floating gates that comprises three layers separated by two dielectric layers (an upper dielectric layer and lower dielectric layer). The dielectric layers may be an oxide layers, nitride layers, combinations of oxide and nitride, or some other suitable dielectric material. The lower dielectric layer is close to the bottom of the floating gate (near interface between floating gate and tunnel dielectric), while the upper dielectric layer is close to top of the floating gate (near interface between floating gate and inter-gate dielectric).

32 Claims, 8 Drawing Sheets

(56) References Cited

U.S. PATENT DOCUMENTS

| | | | |
|---|---|---|---|
| 6,753,572 B2* | 6/2004 | Lee et al. | 257/324 |
| 7,012,299 B2* | 3/2006 | Mahajani et al. | 257/324 |
| 7,501,321 B2* | 3/2009 | Tuntasood et al. | 438/258 |
| 7,602,067 B2* | 10/2009 | Ma et al. | 257/760 |
| 7,615,447 B2* | 11/2009 | Purayath et al. | 438/257 |
| 7,842,992 B2 | 11/2010 | Yamazaki | |
| 8,431,984 B2* | 4/2013 | Park et al. | 257/324 |
| 2006/0054943 A1 | 3/2006 | Li | |
| 2007/0132004 A1 | 6/2007 | Yasuda | |
| 2007/0235793 A1 | 10/2007 | Yamazaki | |
| 2008/0067577 A1* | 3/2008 | Wang et al. | 257/321 |
| 2009/0014774 A1* | 1/2009 | Ono | 257/316 |
| 2009/0085094 A1 | 4/2009 | Lee | |
| 2009/0140317 A1 | 6/2009 | Rosmeulen | |
| 2011/0122698 A1 | 5/2011 | Izumida | |
| 2011/0309430 A1* | 12/2011 | Purayath et al. | 257/321 |
| 2013/0175599 A1* | 7/2013 | Yang et al. | 257/324 |

OTHER PUBLICATIONS

PCT International Search Report dated Mar. 20, 2013, PCT Patent Application No. PCT/US2012/070833.

PCT Written Opinion of the International Searching Authority dated Mar. 20, 2013, PCT Patent Application No. PCT/US2012/070833.

* cited by examiner

NON-VOLATILE STORAGE SYSTEM WITH THREE LAYER FLOATING GATE

This application claim priority to U.S. Provisional Application 61/580,203, "Non-Volatile Storage System With Three Layer Floating Gate," filed on Dec. 24, 2011, incorporated herein by reference in its entirety.

BACKGROUND

1. Field

The technology described herein is directed to non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage Vt of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

To read multi-state memory cells, the memory system steps through various predefined control gate voltages corresponding to the various memory states supported by the memory. A sense amplifier may trip (e.g., indicating flow of current) at one or more of these voltages and the system will determine the resultant memory state by consideration of the tripping event(s) of the sense amplifier.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage (Vpgm) applied to the control gate during a programming process is applied as a series of pulses in which the magnitude of the pulses is increased by a predetermined step size ΔVpgm for each successive pulse. Between pulses, one or more verify operations are performed to determine which memory cells have reached their target.

Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. One implementation of an erase process includes applying several erase pulses to the p-well and verifying between erase pulses whether the NAND strings are properly erased.

To increase the capacity of a memory devices, designers of memory systems have aggressively scaled down the size of the devices. However, such reduction in size can cause problems. For example, as the size of memory cells decrease, the amount of noise experienced during programming increases. During programming the program voltage Vpgm is applied to the control gates as a series of pulses that are stepped up for each pulse by a step size of ΔVpgm. In response to each pulse, the threshold voltage of the memory cells, on average, increases by ΔVt=ΔVpgm. Due to quantum mechanical fluctuations, or other phenomena, the number of electrons injected into the floating gates in response to each pulse may vary across a population of memory cells at any given program pulse; or for a specific cell across different program pulses, thereby causing small variations in threshold voltages. In other words, sometimes ΔVt≠ΔVpgm for some memory cells and there is a distribution of ΔVt in response to a pulse of the program voltage Vpgm. This deviation from the ideal program behavior (ΔVt=ΔVpgm) is referred to as program noise. Program noise can be increased due to manufacturing differences, portions of the floating gate going into depletion, and other conditions. Program noise can result in over programming and/or overlapping threshold voltage distributions among the programmed data states (which lead to read errors)

DETAILED DESCRIPTION

Figures 1, 2:
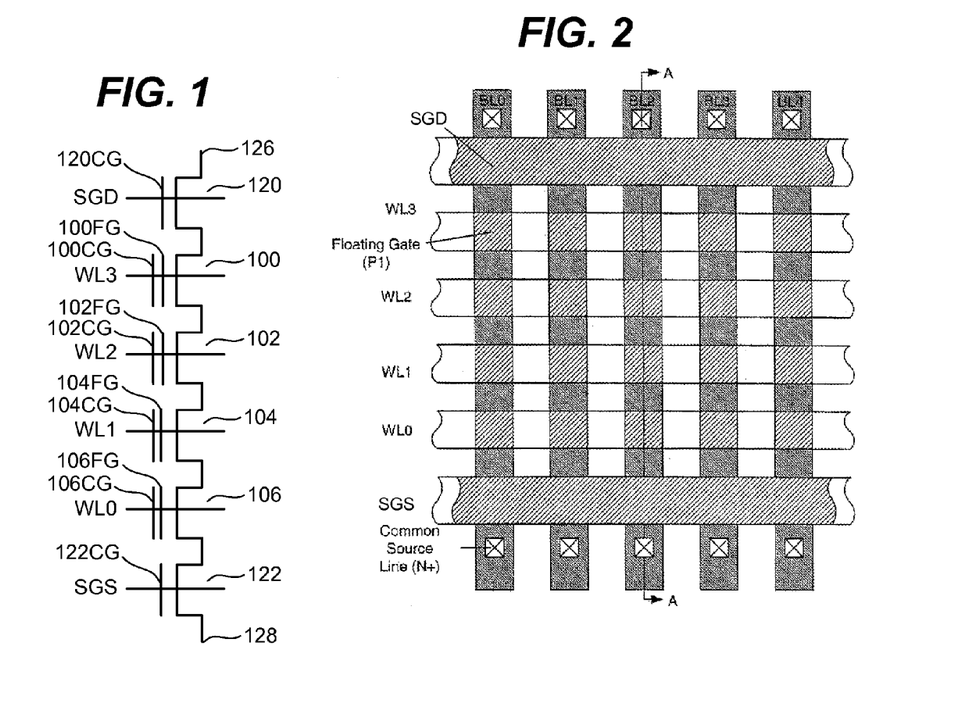
FIG. 1 is a circuit diagram of a NAND string.
FIG. 2 is a plan view of a portion of a NAND flash memory array.

The technology described herein can be used with various types of non-volatile storage systems. One example is a flash memory system uses the NAND structure, which includes arranging multiple transistors in series, sandwiched between two select gates. The transistors in series and the select gates are referred to as a NAND string. FIG. 1 is circuit diagram depicting a NAND string that includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND, as well as other types of non-volatile memory.

A portion of a traditional NAND memory array is shown in plan view in FIG. 2. BL0-BL4 represent bit line connections to global vertical metal bit lines (not shown). Four floating gate memory cells are shown in each string by way of example. Typically, the individual NAND strings include 16, 32, 64, 128 or more memory cells, forming a column of memory cells. Control gate (word) lines labeled WL0-WL3 extend across multiple strings over rows of floating gates, often in polysilicon.

Figure 3:
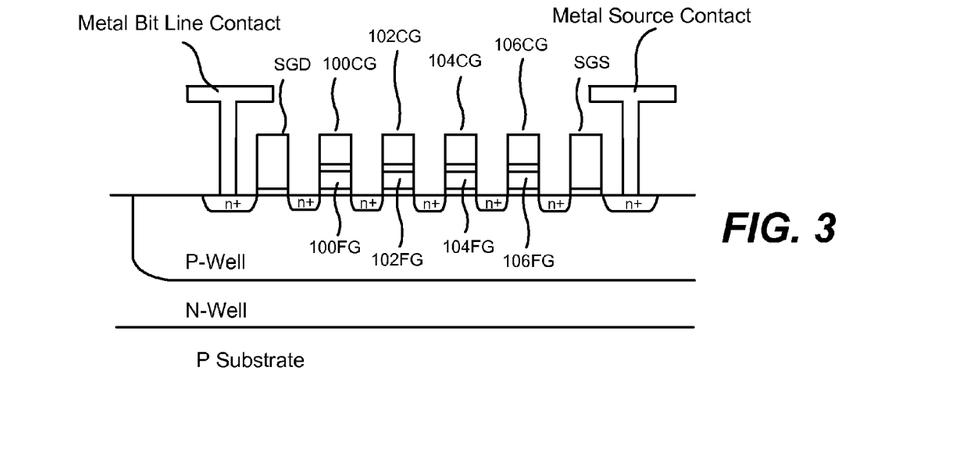
FIG. 3 is an orthogonal cross-sectional view taken along line A-A of the portion of the flash memory array depicted in FIG. 2.

FIG. 3 is a cross-sectional view taken along line A-A of FIG. 2, showing one NAND string. The NAND string includes four memory cells. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. The control gates (100CG, 102CG, 104CG, 106CG) are typically formed over the floating gates (100FG, 102FG, 104FG, 106FG) as a self-aligned stack, and are capacitively coupled to the floating gates through an intermediate dielectric layer (known as the inter-grate dielectric). The top and bottom of the NAND string connect to a bit line (see Metal Bit Line Contact 126) and a common source line (see Metal Source Line Contact 128) through select transistors (gates) 120 and 122, respectively. Gate 170 is controlled by selection line DSL and gate 172 is controlled by selection line SSL. The floating gate material can be shorted to the control gate for the select transistors to be used as the active gate.

Each memory cells includes a floating gate stack that comprises a floating gate, a control gate and appropriate dielectrics. The floating gate stack is implemented on the top surface of a P-Well, where the P-Well is within an N-Well and the N-Well is positioned in a P type substrate. Between floating gate stacks are n+ diffusion regions, in the P-Well. The n+ diffusion regions serve as the source/drain regions for adjacent floating gate stacks.

Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 4:
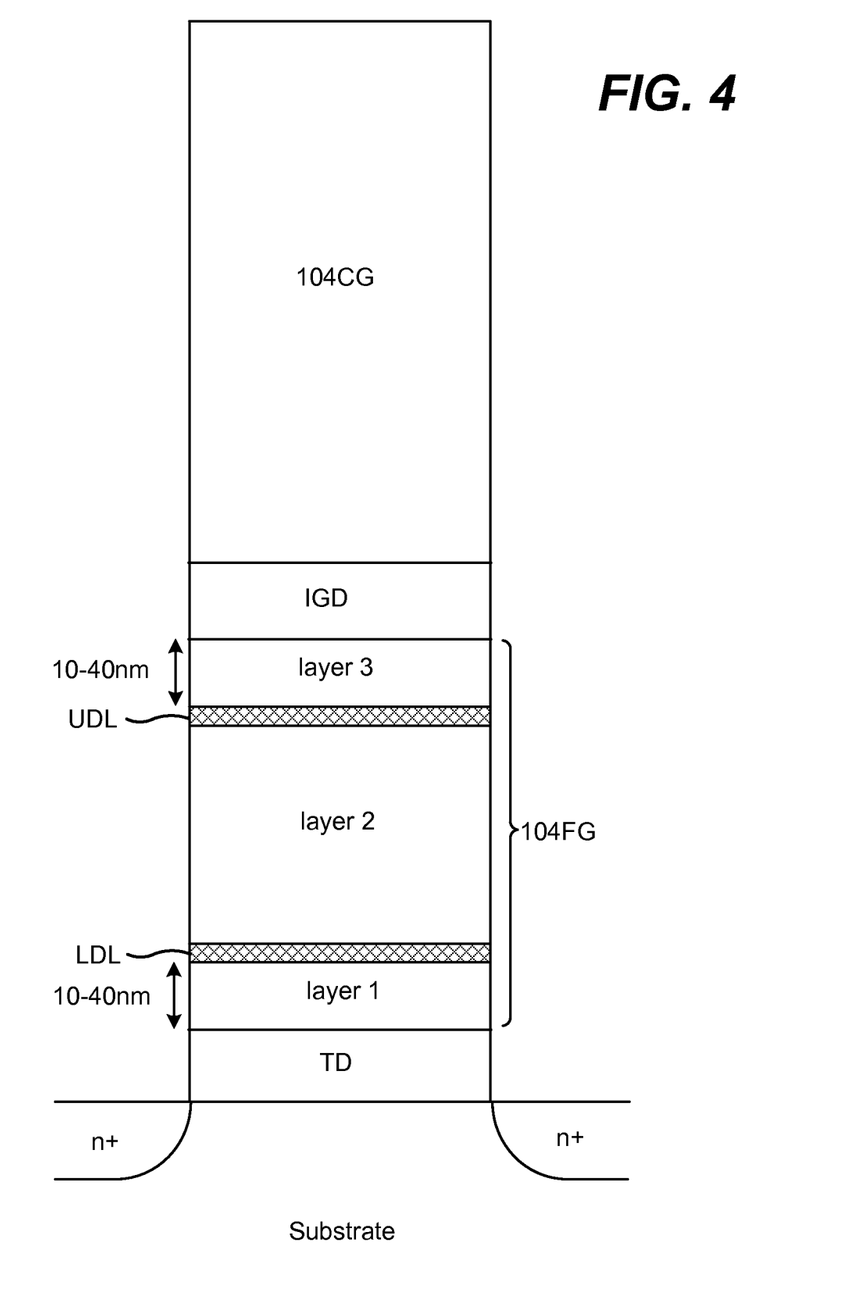
FIG. 4 depicts one example memory cell from the portion of the flash memory array depicted in FIG. 3.

FIG. 4 depicts more details of one of the memory cells of the NAND string depicted in FIG. 3. Each of the memory cells on the NAND string of FIG. 3 will be implemented using the structure depicted in FIG. 4.

The memory cells of FIG. 4 includes n+ source/drain regions implemented in the substrate and a floating gate stack implemented on top of the substrate. The floating gate stack includes a tunnel dielectric TD on the top surface of the substrate, a floating gate 104FG on top of the tunnel dielectric layer TD, an inter-gate dielectric IGD on top of floating gate 104FG, and a control gate 104CG on top of the inter-gate dielectric IGD. In one embodiment, the tunnel dielectric TD and the inter-gate dielectric IGD comprise $SiO_2$; however, other dielectric materials can also be used.

The control gate can be made of any one of various suitable materials, including semiconductors and/or metals. In one embodiment, the control gate is made from polysilicon, Tungsten, Tungsten Nitride or a combination of the above-listed materials. Other materials can also be used.

The floating gate (104FG) includes three layers of floating gate material or other conductive material (including semiconductor material and/or metal). For example, FIG. 4 shows floating gate (104FG) comprising layer 1, layer 2 and layer 3, all of which (in one embodiment) are made of polysilicon; however, other materials can be used (e.g., Tungsten, Tungsten Nitride or a combination of the above-listed materials). A lower dielectric layer LDL separates layer 1 from layer 2. An upper dielectric layer UDL separates layer 2 from layer 3. In one embodiment, lower dielectric layer LDL and upper dielectric layer UDL are made of $SiO_2$; however, other dielectric materials can also be used. In some embodiments, lower dielectric layer LDL and upper dielectric layer UDL are made of nitride. In some embodiments, lower dielectric layer LDL and upper dielectric layer UDL are made of nitride and $SiO_2$. Thus, floating gate (104FG) includes three separate charge storing layers separated by dielectric layers.

Lower dielectric layer LDL is close to the bottom of the floating gate (the interface between the floating gate and the tunnel dielectric TD), while the upper dielectric layer UDL is close to the top of the floating gate (the interface between the floating gate and the inter-gate dielectric IGD). In one set of embodiments, the upper dielectric layer UDL is close to a top of the floating gate such that it is less than one third of the height of the floating gate down from the top of the floating gate and the lower dielectric layer LDL is close to a bottom of the floating gate such that it is less than one third of the height of the floating gate up from the bottom of the floating gate. In one example, lower dielectric layer LDL is 10 nm to 40 nm above the bottom interface of the floating gate, while the upper dielectric layer UDL is 10 nm to 40 nm below the top interface of the floating gate. Different positions of the dielectric layers may be used. The thickness of the dielectric layers LDL and UDL should be between 0.5 nm to 1.5 nm. If the layer is too thick, it prevents free transport of electrons/holes within the floating gate. However if the dielectric layer is too thin, it may not be sufficient to isolate one floating layer from another.

In one embodiment, layer 1 is less than one third of the height of the total floating gate, layer 2 is more than one third of the height of the total floating gate, and layer 3 is less than one third of the height of the total floating gate. In such an embodiment, upper dielectric layer UDL is close to the top interface of the floating gate such that it is less than one third of the height of the floating gate down from the top of the floating gate and lower dielectric layer LDL is less than one third of the height of the floating gate up from the bottom of the floating gate.

The two dielectric layers may be made of same material or different material. For example, upper dielectric layer UDL may be an oxide, while lower dielectric layer LDL may be nitride, or vice versa. Apart from the helping with generation of electron-hole pairs, the dielectric layer also helps with separating floating layers that may be doped with different specie or different dopant dose, ensuring that there is no mixing between the two adjacent floating layers. The material of choice for the dielectric layer may be dependent on the impurity that was doped. For example, boron is known to diffuse through oxide, but not nitride. Thus, to separate Boron dopant between different floating gate layers, a nitride may be used for the dielectric layer.

Another advantage of having dielectric layers within the floating gate is that it offers control over the grain size of the polycrystalline silicon. For example, a polysilicon floating gate having no dielectric-layer will have larger grain size and thus its behavior will be close to single crystal silicon. Dielectric layers restrict the growth of the grains by separating one layer of floating gate from another, resulting in a smaller grain size. A smaller grain size is preferred since it helps with electron-hole pair generation by creating of interface states between adjacent grains. Easier electron-hole pair generation, in turn helps with floating gate depletion to inversion transition, thus improving the program noise.

In one embodiment, layer 1, layer 2 and layer 3 are made of p+ polysilicon. In other embodiments p, p−, n, n− and n+ polysilicon can also be used. Here 'p' or 'n' refers to the type of dopant or conductivity, where p indicates acceptor-type (such as Boron) while n indicates donor type (such as Phosphorus). The '+' and refers to the strength of doping, where '+' indicates higher doping levels, while indicates lower doping levels. In some embodiments, layer 1, layer 2 and layer 3 are made from the same materials. In other embodiments, layer 1, layer 2 and layer 3 are made from different materials. In some embodiments, layer 1, layer 2 and layer 3 are made using the same doping (including same conductivity type). In other embodiments, layer 1, layer 2 and layer 3 are made using different doping (including different conductivity type or same conductivity type but different amounts). The three layers of the floating gate can have different doping profiles. Even if the doping is the same type, the amount of doping may vary among the layers. For example, in one embodiment, layer 1 is p+ polysilicon, layer 2 is p polysilicon and layer 3 is p polysilicon. In another embodiment, layer 1 is p+ polysilicon, layer 2 is intrinsic polysilicon and layer 3 is n+ polysilicon. In another embodiment, layer 1 is n+ polysilicon, layer 2 is p+ polysilicon and layer 3 is p+ polysilicon. In another embodiment, layer 1 is p+ polysilicon, layer 2 is p− polysilicon and layer 3 is n+ polysilicon. Other combinations can also be used. Apart from standard donor and acceptor dopings (Boron, Phosphorus, Arsenic etc.), Nitrogen doping or Carbon doping may also be done, and combinations of them are also possible. One or more floating gate layers may be undoped (intrinsic polysilicon) or a metal (such as W, Cu etc).

In some embodiments, the floating gate can include more than three separate charge storing layers separated by dielectric layers.

One or more of the floating gate layers (layer 1, layer 2 and layer 3) may receive a dosage of certain heavy atoms (such as As) that can create defects in floating gate's polysilicon, which can help with generation of electron-hole pairs, which may help with inversion layer formation (as the dielectric layers UDL and LDL do).

It has been observed that for n+ polysilicon floating gate, the presence of the lower dielectric layer LDL reduces program noise during a program process. In other words, when the floating gates include the lower dielectric layer LDL, the change in threshold voltage $\Delta Vt$ of a memory cell in response to a program pulse is more likely to be equal to $\Delta Vpgm$, thereby resulting in a tighter threshold voltage distribution of programmed data states and less over programming, both of which lead to less subsequent read errors.

The presence of the upper dielectric layer UDL may reduce noise during an erase process for a n+ polysilicon floating gate. In other words, when the floating gates include the upper dielectric layer UDL, the changes in threshold voltage $\Delta Vt$ of the memory cell in response to an erase pulse is more likely to be uniform (or close to uniform), thereby resulting in a tighter erase threshold voltage distribution and less over erasing, both of which lead to less subsequent programming problems and improved endurance.

The presence of the upper dielectric layer UDL may reduce program noise during a programming process for a p+ polysilicon floating gate. The presence of the lower dielectric layer LDL reduces noise during an erase process.

Figure 5:
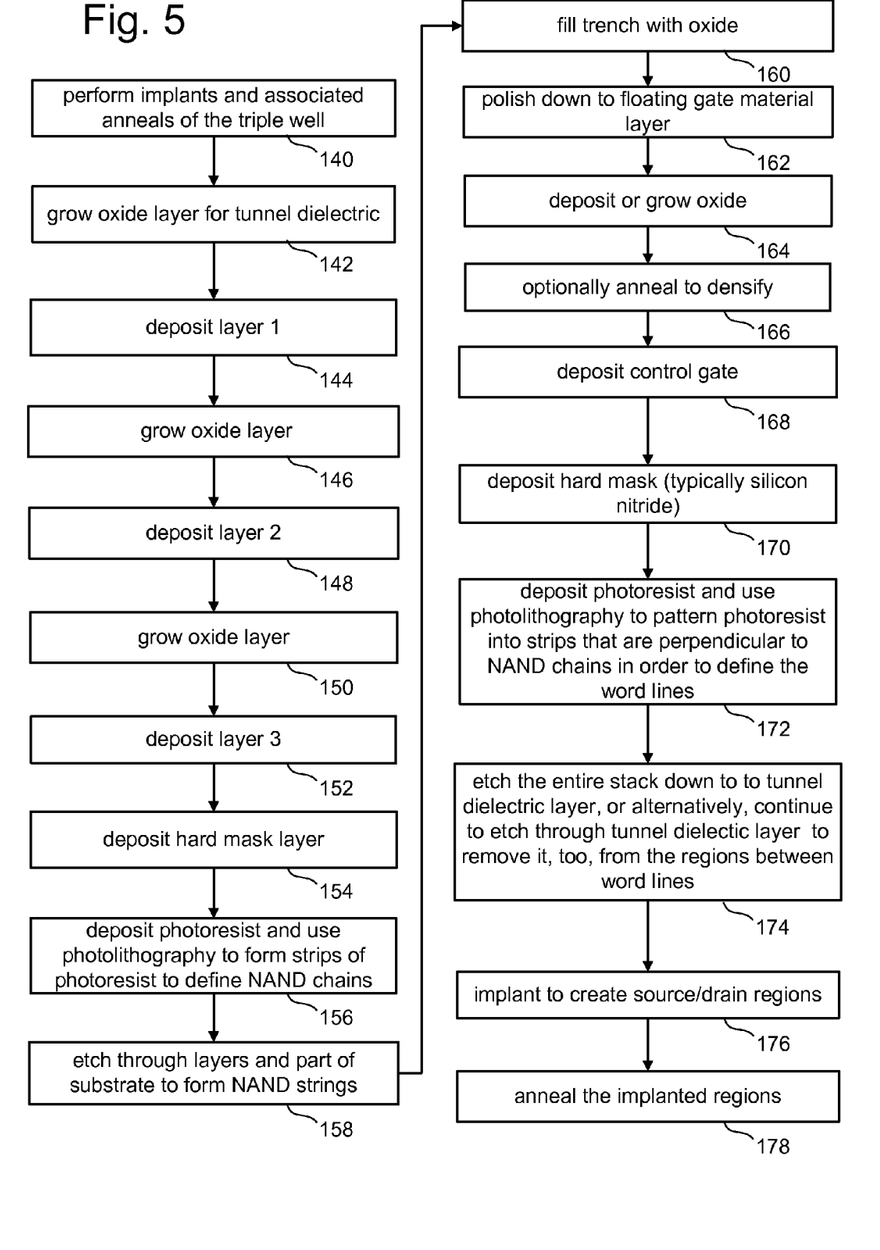
FIG. 5 is a flow chart describing one embodiment of a process for fabricating non-volatile storage.

FIG. 5 is a flow chart describing one embodiment of the front end of a process for manufacturing the memory cell of FIG. 4, which covers process steps only as far as forming the source/drain regions. This flow does not cover the optional booster plates or fins, the gap fill of etched volumes between the stacks, or forming the contacts, metallizations, vias, and passivation. There are many ways to manufacture memory according to the present invention and, thus, the inventors contemplate that various methods other than that described by FIG. 5 can be used. While a flash memory chip will consist of both a peripheral circuitry, which includes a variety of low, medium, and high voltage transistors, and the core memory array, the process steps of FIG. 5 are intended only to describe in general terms one possible process recipe for the fabrication of the core memory array. Many photolithography, etch, implant, diffusion and oxidation steps that are intended for the fabrication of the peripheral transistors are omitted.

Figure 6A:
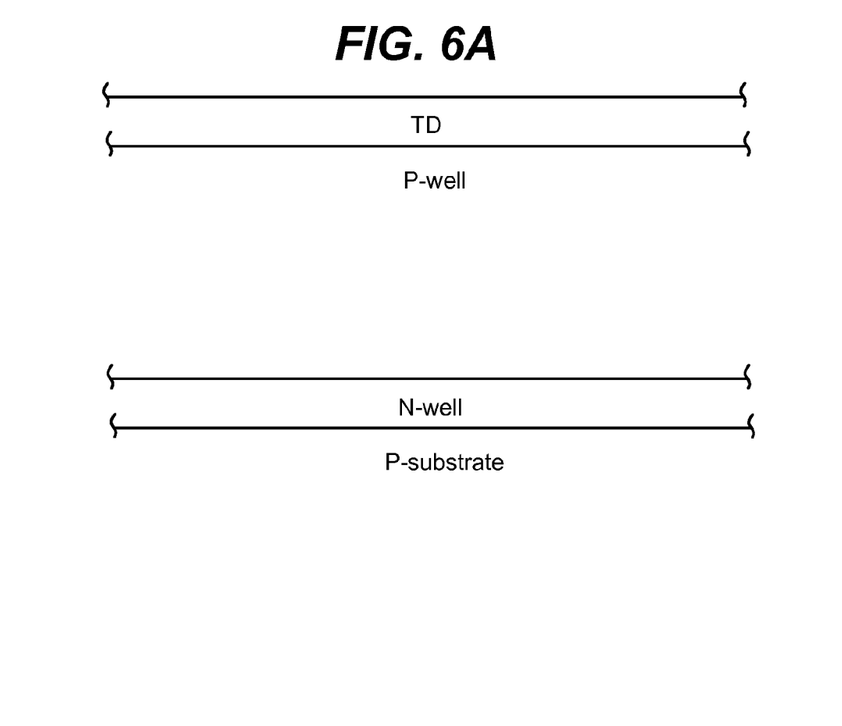
FIGS. 6A-D depict non-volatile storage during various stages of fabrication.

Step 140 of FIG. 5 includes performing implants and associated anneals of the triple well. In step 142, the tunnel dielectric TD (e.g., oxide) is grown or deposited using ALD, CVD, PVD, Jet Vapor Deposition (JVD) or another suitable process. The result of step 142 is depicted in FIG. 6A, which depicts the P substrate, N-well within the P-substrate, and P-Well within the N-well 22. The sidewalls of the N-well that isolate the P-wells from one another are not depicted. Also the N-well depth is typically much thicker than that of the P-well in contrast to FIG. 6A. The P substrate is usually the thickest consisting of the majority of the wafer thickness. On the top surface of the P-well is the tunnel dielectric TD oxide.

Figure 6B:
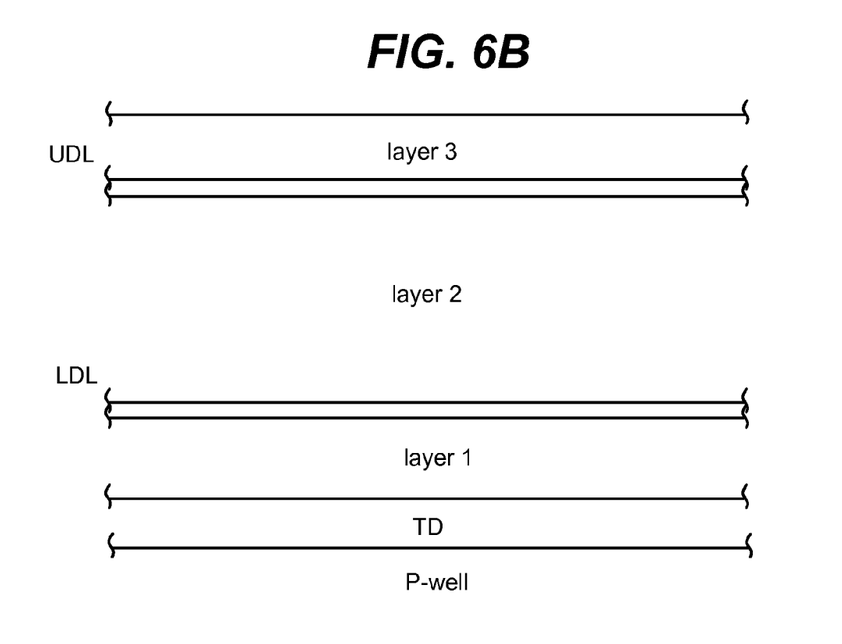

Steps 144-152 include creating the three layer floating gate. In step 144, layer 1 (e.g., polysilicon) of the floating gate is deposited over tunnel dielectric TD using CVD, PVD, ALD or another suitable method. In step 146, the lower dielectric layer LDL (e.g., oxide) is grown or deposited over layer 1 using ALD, CVD, PVD, Jet Vapor Deposition (JVD) or another suitable process. In step 148, layer 2 (e.g., polysilicon) of the floating gate is deposited over lower dielectric layer LDL using CVD, PVD, ALD or another suitable method. In step 150, the upper dielectric layer UDL (e.g., oxide) is grown or deposited over layer 2 using ALD, CVD, PVD, Jet Vapor Deposition (JVD) or another suitable process. In step 152 layer 3 (e.g., polysilicon) of the floating gate is deposited over upper dielectric layer UDL using CVD, PVD, ALD or another suitable method. FIG. 6B shows the memory structure after step 152, including layer 1 over tunnel dielectric TD, lower dielectric layer LDL over layer 1, layer 2 over lower dielectric layer LDL, upper dielectric layer UDL over layer 2, and layer 3 over upper dielectric layer UDL. Note that FIG. 6B does not show the N-Well or P-Substrate, in order to simplify the drawing.

Step 154 of FIG. 5 includes depositing a hard mask using, for example, CVD, to deposit $SiO_2$ or $Si_3N_4$. In step 156, photolithography is used to form strips of photoresist over what will become the NAND chains. Step 158 includes etching through all layers, including part of the substrate. First, the hard mask is etched through using anisotropic plasma etching, (i.e. reactive ion etching with the proper balance between physical and chemical etching for each planar layer encountered). After the hard mask layer is etched into strips, the photoresist can be stripped away and the hard mask layer can be used as the mask for etching the underlying layers. The process, then includes etching through the floating gate material, the tunnel dielectric material and into the substrate to create trenches between the NAND strings, where the bottom of the trenches are inside the top of the P-well. In step 160, the trenches are filled with $SiO_2$ (or another suitable material) up to the top of the hard mask using CVD, rapid ALD or PSZ STI fill as described in "Void Free and Low Stress Shallow Trench Isolation Technology using P-SOG for sub 0.1 Device" by Jin-Hwa Heo, et. al. in 2002 Symposium on VLSI Technology Digest of Technical Papers, Session 14-1. PSZ STI fill is Polysilazane Shallow trench isolation fill. The fill sequence includes spin coat by coater, and densify by furnace. Si—N bond conversion to Si—O bond enables less shrinkage than conventional SOG (Spin On Glass). Steam oxidation is effective for efficient conversion. One proposal is to use Spin-On-Glass (SOG) for the dielectric layer, which is called polysilazane-based SOG (SZ-SOG), a material used in integrating the inter layer dielectric (ILD) applications because of its excellent gap filling and planarization properties, and thermal oxide like film qualities.

In step 162, Chemical Mechanical Polishing (CMP), or another suitable process, is used to polish the material flat until reaching the floating gate poly-silicon. In step 164, the inter-gate dielectric IGD is grown or deposited using ALD, CVD, PVD, Jet Vapor Deposition (JVD) or another suitable process. Examples of materials that can be used for the inter-gate dielectric IGD include (but are not limited to) $SiO_2$, $Si_3N_4$, an alloy with a varying mole fraction as a function of depth, an alloy or nano-laminate of aluminum oxide and silicon oxide, an alloy or nano-laminate of silicon nitride and silicon oxide, an alloy or nano-laminate of silicon oxide and hafnium oxide, an alloy or nano-laminate of aluminum oxide and hafnium oxide, or other suitable materials. In step 166 of FIG. 5, which is an optional step, the inter-gate dielectric IGD is annealed to densify the oxide.

Figure 6C:
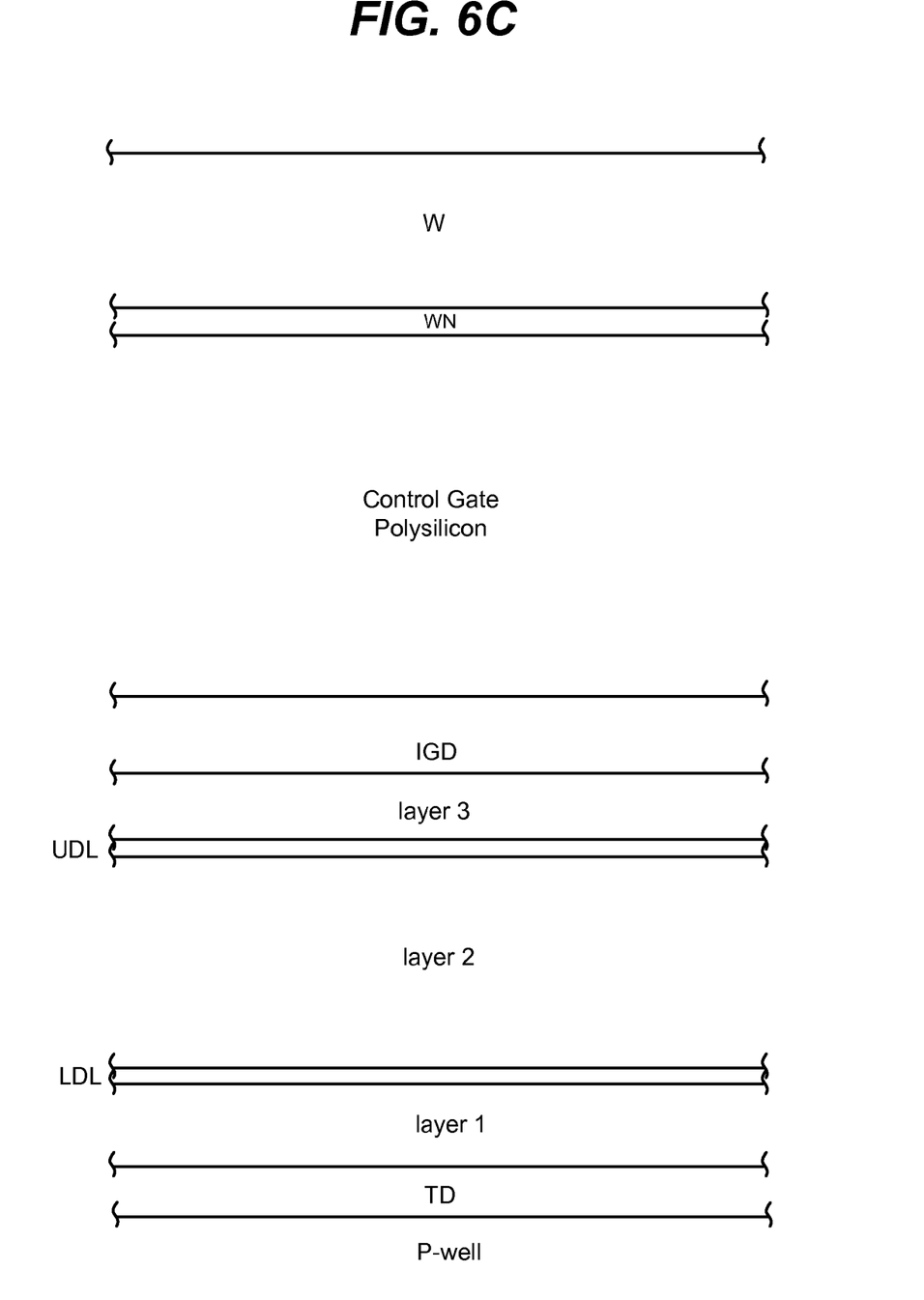

In step 168, the one or more layers of the control gate are deposited on the inter-gate dielectric IGD. In one embodiment, the materials deposited during step 168 include a poly-silicon, while in other embodiments this layer may be a metal layer with a proper work function, thermal stability, and etch characteristics. In some embodiments, the control gate is composed of the poly-silicon layer, tungsten-nitride layer, and tungsten layer, all of which are deposited in step 168. The nitride layer and tungsten layer are deposited to reduce the control gate sheet resistance and form lower resistivity word lines. These materials can be deposited in a blanket form using CVD, ALD, PVD or other suitable process. FIG. 6C, which shows the Control Gate Polysilicon, WN layer and Tungsten W metal layer 40 over inter-gate dielectric IGD, depicts the device after step 168.

Figure 6D:
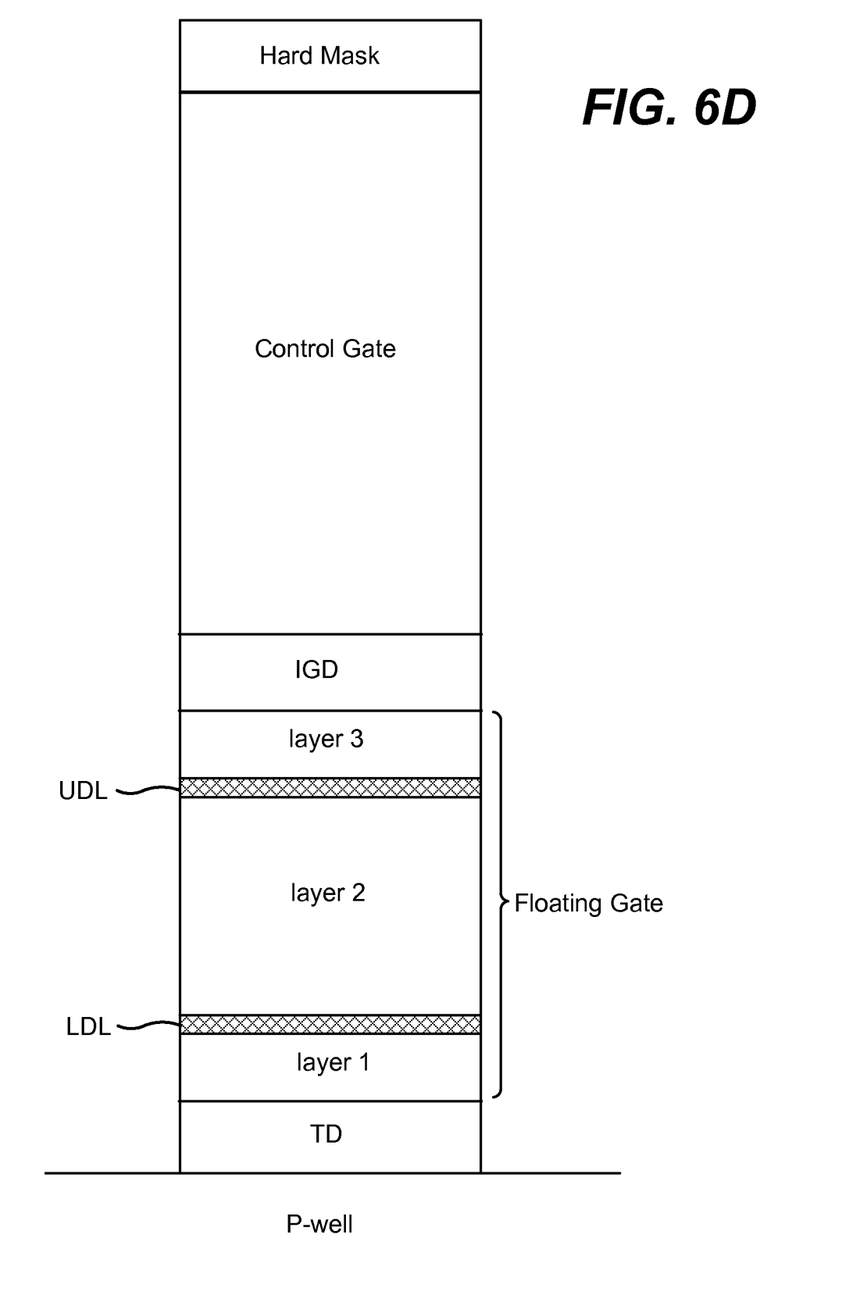

On top of the Tungsten layer, a hard mask of $Si_3N_4$ is deposited using, for example, CVD in step 170. In step 172, photolithography is used to create patterns of perpendicular strips to the NAND chain, in order to etch the multi-gate stack and form word lines (i.e. control gates) that are isolated from one another. In step 174, etching is performed using plasma etching, ion milling, ion etching that is purely physical etching, or another suitable process to etch the various layers and form the individual word lines. In one embodiment, the etching is performed until the tunnel dielectric TD is reached. In another embodiment, the process will etch all the way to the substrate. FIG. 6D, which shows the floating gate stack, depicts the device after step 174.

In step 176, an implant process is performed to create the N+ source/drain regions by Arsenic implantation. In one embodiment, a halo implant is also used. In step 178, an anneal process is performed. There are many alternatives to the above described structures and processes within the spirit of the present invention.

In one proposed embodiment of the p+ poly silicon three layer floating gate (with p+ polysilicon control gate), a first layer which is 25 nm un-doped poly Si is deposited and then 55 nm 2nd un-doped polysilicon is deposited after $O_2$ purge. Next, $O_2$ purge is done again to separate 2nd and 3rd polysilicon before 25 nm 3rd layer polysilicon deposition. Thus, the three layer polysilicon floating gate (three layers of polysilicon) which are separated by $SiO_2$ is formed. Each layers' thickness should be optimized to minimize the program noise, thereby resulting in a tighter threshold voltage distribution of programmed data states. To make these 3-layers P+ polysilicon, Boron (ex. 5 keV, 3.0 E+15 $cm^{-2}$) is implanted, using a lithography mask that covers peripheral area. After that, Phos. (ex. 5 keV, 3.0 E+15 $cm^{-2}$) for N+ polysilicon of peripheral transistors (not in the memory array) is implanted while the cell area is covered with the lithography mask. In an alternative, Boron is implanted in all areas (blanket implant), and later Phosphorous is implanted in peripheral transistors area (only) to counter the Boron dose. Such a method can reduce the number of masks involved in the process, which is a cost saving. However, it comes with the difficulty of optimizing the counter-implant and some side effects that Boron implantation in peripheral transistors area may cause. Either way, both Boron and Phosphorous implantation energy needs to be low enough to avoid Boron and Phosphorous penetration through floating gate polysilicon to tunnel dielectric and silicon substrate. After some wet cleaning and ashing processes, the top of the floating gate is oxidized by Rapid Thermal Oxidation (ex. 950 C, 20 sec) for Boron and Phosphorous atom's activation. Thus, a 3layer P+ polysilicon floating gate is formed.

In above process, the $O_2$ purge process is used to separate the three layers with oxide, however, $N_2$ or $NH_3$ purge process is another suitable candidate to separate the three layers with nitride. In the later case, as Boron diffusion is easily blocked by $N_2$ or $NH_3$ purged layer, 2 or 3 step Boron implantation is another method (ex, 1 keV+3 keV+5 keV).

After forming the 3-layer floating gate, conventional STI and EB processes are applied and Boron doped GC-1 polysilicon and GC-2 polysilicon is formed. After that, Phosphorous is implanted to peripheral region after lithography process to cover cell area. Thus, P+ floating gate/control gate for memory cells and N+ poly gate for peripheral transistors are formed.

Figure 7:
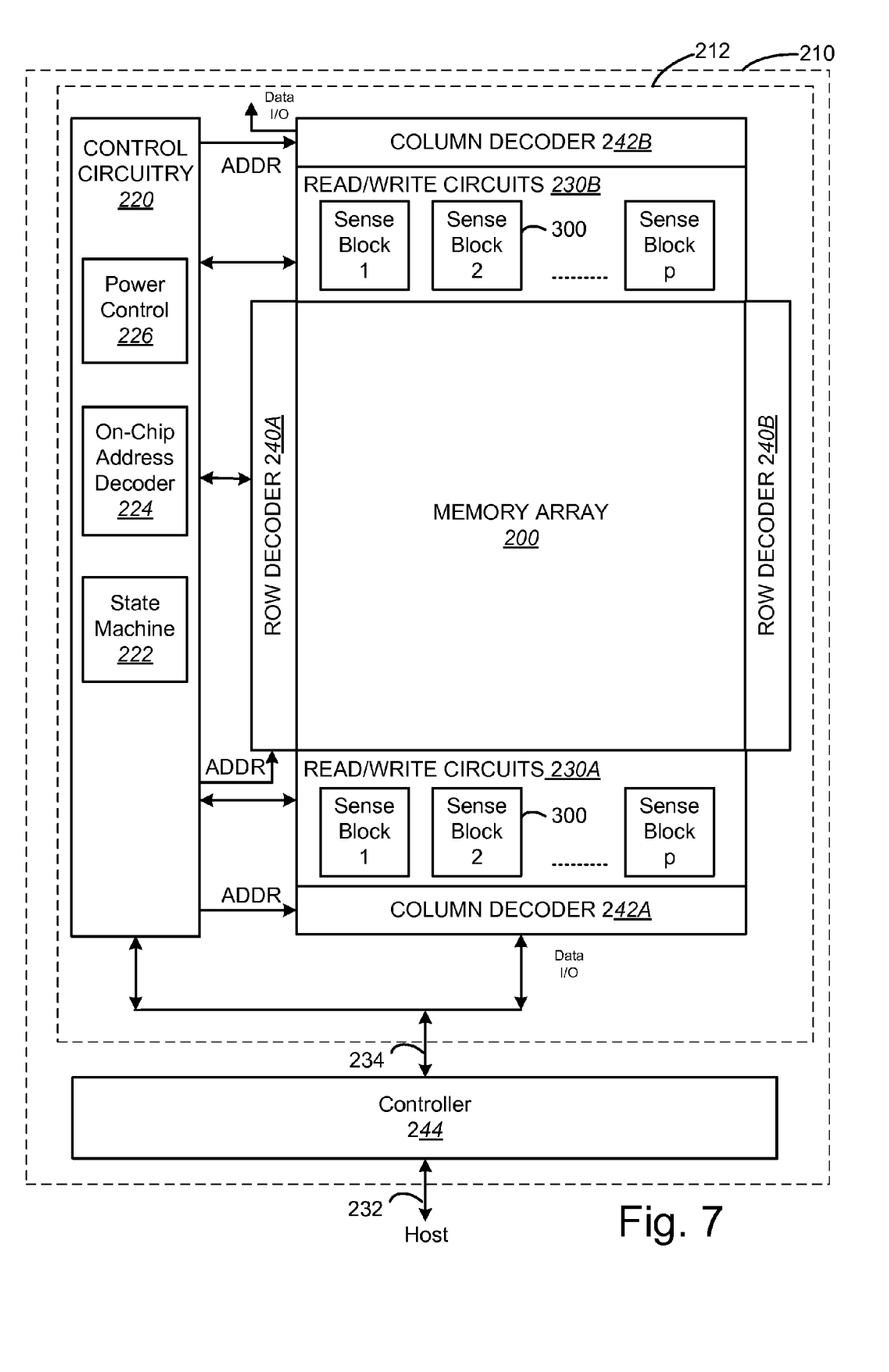
FIG. 7 is a block diagram of a non-volatile memory system.

FIG. 7 illustrates a memory system that includes memory cells of the structure described above. Memory device 210 having read/write circuits for reading and programming a page (or other unit) of memory cells (e.g., NAND multi-state flash memory or other type) in parallel. Memory device 210 may include one or more memory die or chips 212. Memory die 212 includes an array (two-dimensional or three dimensional) of memory cells 200 (fabricated as discussed above), control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212; however, the controller can also be separate. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes to read, write and program.

Figure 8:
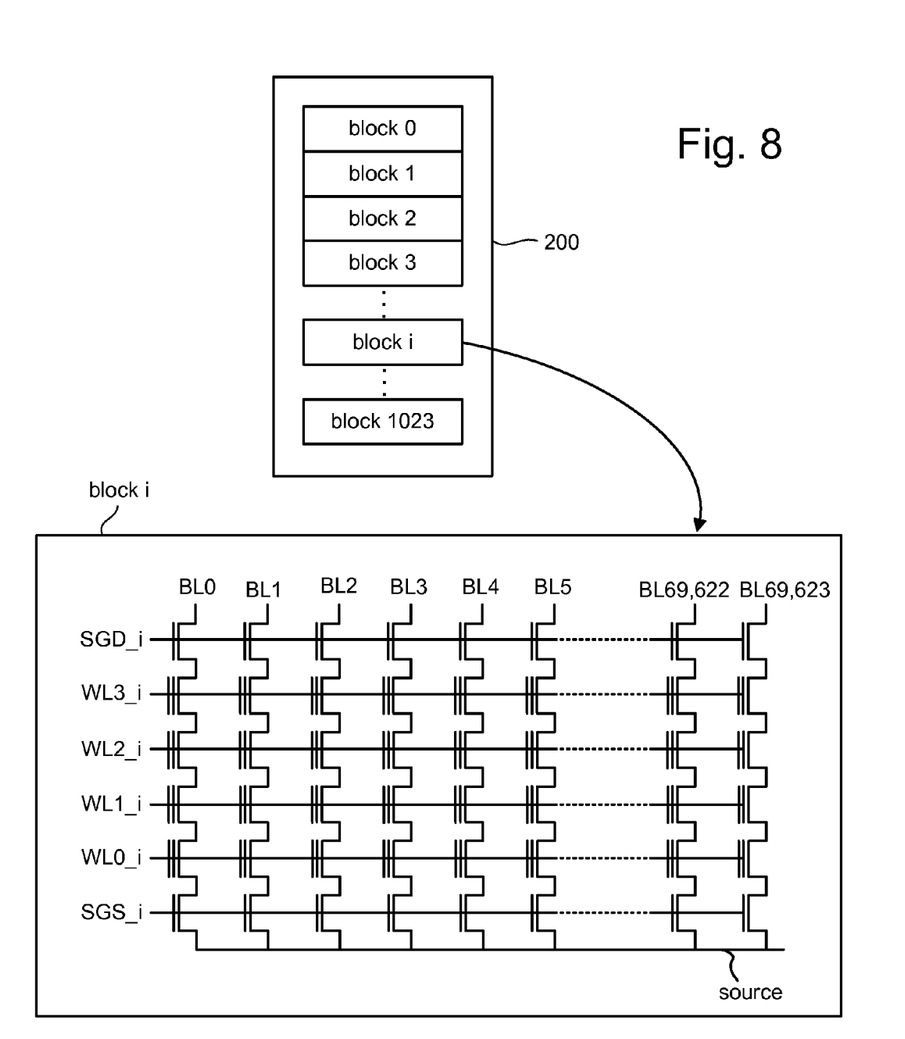
FIG. 8 is a block diagram depicting one embodiment of a memory array.

FIG. 8 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of eras can also be used. The memory cells of array 200 are fabricated as discussed above.

A block contains a set of NAND stings which are accessed via bit lines (e.g., bit lines BL0-BL69623) and word lines (WL0, WL1, WL2, WL3). FIG. 8 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

One embodiment includes a non-volatile storage device, comprising: a floating gate comprising three separate charge storage layers separated by floating gate dielectric layers; a tunnel dielectric layer on a surface of a substrate, between the substrate and the floating gate; a control gate; and an inter-gate dielectric between the floating gate and the control gate.

One embodiment includes a non-volatile storage device, comprising: a substrate; a tunnel dielectric layer on a surface of the substrate; a bottom charge storing layer of a floating gate above the tunnel dielectric layer; a lower dielectric layer above the bottom charge storing layer of the floating gate; a middle charge storing layer of the floating gate above the lower dielectric layer; an upper dielectric layer above the middle charge storing layer of the floating gate; a top charge storing layer of the floating gate above the upper dielectric layer; an inter-gate dielectric layer above the top charge storing layer of the floating gate; and a control gate layer above the inter-gate dielectric layer.

One embodiment includes a method for fabricating non-volatile storage, comprising: adding a tunnel dielectric layer on a surface of a substrate; adding a bottom charge storage layer of a floating gate above the tunnel dielectric layer; adding a lower dielectric layer above the bottom charge storage layer of the floating gate; adding a middle charge storage layer of the floating gate above the lower dielectric layer; adding an upper dielectric layer above the middle charge storage layer of the floating gate; adding a top charge storage layer of the floating gate above the upper dielectric layer, the middle charge storage layer is separate from the bottom charge storage layer and the top charge storage layer; adding an inter-gate dielectric layer above the top charge storage layer of the floating gate; and adding a control gate layer above the inter-gate dielectric layer. Some embodiments include adding a dosage of heavy atoms to at least one of the bottom charge storage layer, middle charge storage layer or top charge storage layer. In some embodiments, the adding the upper dielectric layer comprises adding the upper dielectric layer close to a top of the floating gate such that it is less than one third of the height of the floating gate down from the top of the floating gate; and the adding the lower dielectric layer comprises adding the lower dielectric layer close to a bottom of the floating gate such that it is less than one third of the height of the floating gate up from the bottom of the floating gate.

One embodiment includes a method for operating non-volatile storage, comprising: programming a non-volatile storage element by adding electrons to a floating gate comprising three separate charge storage layers separated by floating gate dielectric layers, the adding electrons to the floating gate changes a threshold voltage of the non-volatile storage element; and reading the non-volatile storage element by testing a threshold voltage of the non-volatile storage element.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage device, comprising:
    a floating gate comprising three separate charge storage layers separated by floating gate dielectric layers, the three separate charge storage layers are of a same conductivity type but different doping amounts;
    a tunnel dielectric layer on a surface of a substrate, between the substrate and the floating gate;
    a control gate; and
    an inter-gate dielectric between the floating gate and the control gate.

2. The non-volatile storage device according to claim 1, wherein:
    two or more of the three separate charge storage layers include a dosage of heavy atoms.

3. The non-volatile storage device according to claim 1, wherein:
    one or more of the three separate charge storage layers are doped with Carbon.

4. The non-volatile storage device according to claim 1, wherein:
    one or more of the three separate charge storage layers are doped with Nitrogen.

5. The non-volatile storage device according to claim 1, wherein:
    the floating gate dielectric layers comprise an upper dielectric layer and a lower dielectric layer;
    the upper dielectric layer is close to a top of the floating gate such that it is less than one third of the height of the floating gate down from the top of the floating gate; and
    the lower dielectric layer is close to a bottom of the floating gate such that it is less than one third of the height of the floating gate up from the bottom of the floating gate.

6. A non-volatile storage device, comprising:
    a floating gate comprising three separate charge storage layers separated by floating gate dielectric layers, one of the three separate charge storage layers is n type polysilicon, one of the three separate charge storage layers is p type polysilicon, and one of the three separate charge storage layers is intrinsic polysilicon;
    a tunnel dielectric layer on a surface of a substrate, between the substrate and the floating gate;
    a control gate; and
    an inter-gate dielectric between the floating gate and the control gate.

7. The non-volatile storage device according to claim 1, wherein:
    at least one of the three separate charge storage layers is doped with boron.

8. The non-volatile storage device according to claim 1, wherein:
    at least one of the floating gate dielectric layers comprise nitride and oxide.

9. The non-volatile storage device according to claim 1, wherein:
    the floating gate further comprises additional separate charge storage layers separated by floating gate dielectric layers.

10. The non-volatile storage device according to claim 1, wherein:
    the floating gate, tunnel dielectric, control gate and inter-gate dielectric comprise a NAND flash memory cell.

11. A non-volatile storage device, comprising:
a substrate;
a tunnel dielectric layer on a surface of the substrate;
a bottom charge storing layer of a floating gate above the tunnel dielectric layer;
a lower dielectric layer above the bottom charge storing layer of the floating gate;
a middle charge storing layer of the floating gate above the lower dielectric layer;
an upper dielectric layer above the middle charge storing layer of the floating gate;
a top charge storing layer of the floating gate above the upper dielectric layer, the bottom charge storing layer, the middle charge storing layer and the top charge storing layer are of a same conductivity type but different doping amounts;
an inter-gate dielectric layer above the top charge storing layer of the floating gate; and
a control gate layer above the inter-gate dielectric layer.

12. The non-volatile storage device according to claim 11, wherein:
two or more of the bottom charge storing layer, the middle charge storing layer and top charge storing layer include a dosage of heavy atoms.

13. The non-volatile storage device according to claim 11, wherein:
the upper dielectric layer is close to a top of the floating gate such that it is less than one third of the height of the floating gate down from the top of the floating gate; and
the lower dielectric layer is close to a bottom of the floating gate such that it is less than one third of the height of the floating gate up from the bottom of the floating gate.

14. The non-volatile storage device according to claim 11, wherein:
the floating gate further comprises additional separate charge storage layers separated by floating gate dielectric layers.

15. The non-volatile storage device according to claim 11, wherein:
one or more of the bottom charge storing layer, the middle charge storing layer and top charge storing layer are doped with at least one of Carbon or Nitrogen.

16. A method for fabricating non-volatile storage, comprising:
adding a tunnel dielectric layer on a surface of a substrate;
adding a bottom charge storage layer of a floating gate above the tunnel dielectric layer;
adding a lower dielectric layer above the bottom charge storage layer of the floating gate;
adding a middle charge storage layer of the floating gate above the lower dielectric layer;
adding an upper dielectric layer above the middle charge storage layer of the floating gate;
adding a top charge storage layer of the floating gate above the upper dielectric layer, the middle charge storage layer is separate from the bottom charge storage layer and the top charge storage layer, wherein the bottom charge storing layer, the middle charge storing layer and the top charge storing layer are of a same conductivity type but different doping amounts;
adding an inter-gate dielectric layer above the top charge storage layer of the floating gate; and
adding a control gate layer above the inter-gate dielectric layer.

17. The method for fabricating non-volatile storage according to claim 16, wherein:
the adding the lower dielectric layer comprises growing a first oxide layer; and
the adding the upper dielectric layer comprises growing a second oxide layer.

18. The method for fabricating non-volatile storage according to claim 16, further comprising:
adding a dosage of heavy atoms to at least one of the bottom charge storage layer, middle charge storage layer or top charge storage layer.

19. The method for fabricating non-volatile storage according to claim 16, wherein:
the adding the upper dielectric layer comprises adding the upper dielectric layer close to a top of the floating gate such that it is less than one third of the height of the floating gate down from the top of the floating gate; and
the adding the lower dielectric layer comprises adding the lower dielectric layer close to a bottom of the floating gate such that it is less than one third of the height of the floating gate up from the bottom of the floating gate.

20. A method for operating non-volatile storage, comprising:
programming a non-volatile storage element by adding electrons to a floating gate comprising three separate charge storage layers separated by floating gate dielectric layers, the adding electrons to the floating gate changes a threshold voltage of the non-volatile storage element, the three separate charge storage layers are of a same conductivity type but different doping amounts; and
reading the non-volatile storage element by testing a threshold voltage of the non-volatile storage element.

21. The non-volatile storage device according to claim 1, wherein:
the floating gate, tunnel dielectric, control gate and inter-gate dielectric comprise a memory cell in a three dimensional memory structure.

22. The non-volatile storage device according to claim 21, further comprising:
one or more managing circuits in communication with the memory cell, the one or more managing circuits program and read the memory cell;
wherein the substrate is a silicon substrate and the floating gate, tunnel dielectric, control gate and inter-gate dielectric are disposed above the silicon substrate.

23. The non-volatile storage device according to claim 6, wherein:
the floating gate, tunnel dielectric, control gate and inter-gate dielectric comprise a memory cell in a three dimensional memory structure.

24. The non-volatile storage device according to claim 23, further comprising:
one or more managing circuits in communication with the memory cell, the one or more managing circuits program and read the memory cell;
wherein the substrate is a silicon substrate and the floating gate, tunnel dielectric, control gate and inter-gate dielectric are disposed above the silicon substrate.

25. The non-volatile storage device according to claim 6, wherein:
two or more of the three separate charge storage layers include a dosage of heavy atoms.

26. The non-volatile storage device according to claim 6, wherein:
one or more of the three separate charge storage layers are doped with at least one of Carbon or Nitrogen.

27. The non-volatile storage device according to claim 6, wherein:

the floating gate dielectric layers comprise an upper dielectric layer and a lower dielectric layer;

the upper dielectric layer is close to a top of the floating gate such that it is less than one third of the height of the floating gate down from the top of the floating gate; and the lower dielectric layer is close to a bottom of the floating gate such that it is less than one third of the height of the floating gate up from the bottom of the floating gate.

28. The method for fabricating non-volatile storage according to claim 16, wherein:

the tunnel dielectric layer, bottom charge storing layer, lower dielectric layer, middle charge storing layer, upper dielectric layer, top charge storing layer, inter-gate dielectric layer and control gate layer comprise a memory cell in a three dimensional memory structure.

29. The method for fabricating non-volatile storage according to claim 28, further comprising:

adding one or more managing circuits in communication with the memory cell that program and read the memory cell.

30. The method for operating non-volatile storage according to claim 20, wherein:

the floating gate is a component in a memory cell of a three dimensional memory structure in a storage device; and the programming and reading is performed by one or more managing circuits of the storage device.

31. The non-volatile storage device according to claim 11, wherein:

the tunnel dielectric layer, bottom charge storing layer, lower dielectric layer, middle charge storing layer, upper dielectric layer, top charge storing layer, inter-gate dielectric layer and control gate layer comprise a memory cell in a three dimensional memory structure.

32. The non-volatile storage device according to claim 31, wherein:

the substrate is silicon;

the tunnel dielectric layer, bottom charge storing layer, lower dielectric layer, middle charge storing layer, upper dielectric layer, top charge storing layer, inter-gate dielectric layer and control gate layer are disposed above the silicon substrate; and the non-volatile storage device further comprises one or more managing circuits in communication with the memory cell that program and read the memory cell.

\* \* \* \* \*